United States Patent
Kleineberg et al.

(10) Patent No.: US 7,183,747 B2
(45) Date of Patent: Feb. 27, 2007

(54) METHOD AND CIRCUIT ARRANGEMENT FOR DETERMINING THE AVERAGE CURRENT CONSUMPTION OF A BATTERY-OPERATED APPARATUS

(75) Inventors: Stefan Kleineberg, Fuerth (DE); Michael Kauffmann, Teutschenthal (DE)

(73) Assignee: NXP B.V., Eindhoven (NL)

( * ) Notice: Subject to any disclaimer, the term of this patent is extended or adjusted under 35 U.S.C. 154(b) by 269 days.

(21) Appl. No.: 10/504,749

(22) PCT Filed: Feb. 17, 2003

(86) PCT No.: PCT/IB03/00518

§ 371 (c)(1),
(2), (4) Date: Aug. 17, 2004

(87) PCT Pub. No.: WO03/071291

PCT Pub. Date: Aug. 28, 2003

(65) Prior Publication Data

US 2005/0104559 A1    May 19, 2005

(30) Foreign Application Priority Data

Feb. 20, 2002  (DE) ................................ 102 07 062

(51) Int. Cl.
*H02J 7/00* (2006.01)
(52) U.S. Cl. ...................................... 320/132; 320/166
(58) Field of Classification Search ................ 320/132, 320/133, 135, 166
See application file for complete search history.

(56) References Cited

U.S. PATENT DOCUMENTS 5,426,579 A * 6/1995 Paul et al. ................... 363/126
6,157,170 A * 12/2000 Noda et al. ................. 320/132

* cited by examiner

*Primary Examiner*—Gary Laxton
*Assistant Examiner*—Aaron Piggush
(74) *Attorney, Agent, or Firm*—Kevin H. Fortin

(57) ABSTRACT

The average current consumption of an electronic apparatus is determined in that an energy store C is repeatedly charged and discharged across the apparatus 1 between a set upper threshold value Uso and a set lower threshold value Usu during a typical operating sequence of the apparatus 1 and within a set measuring time T. The number N of charging processes occurring within the measuring time T is counted and the average current consumption is calculated therefrom while taking into account set values.

10 Claims, 2 Drawing Sheets

Figure 1:
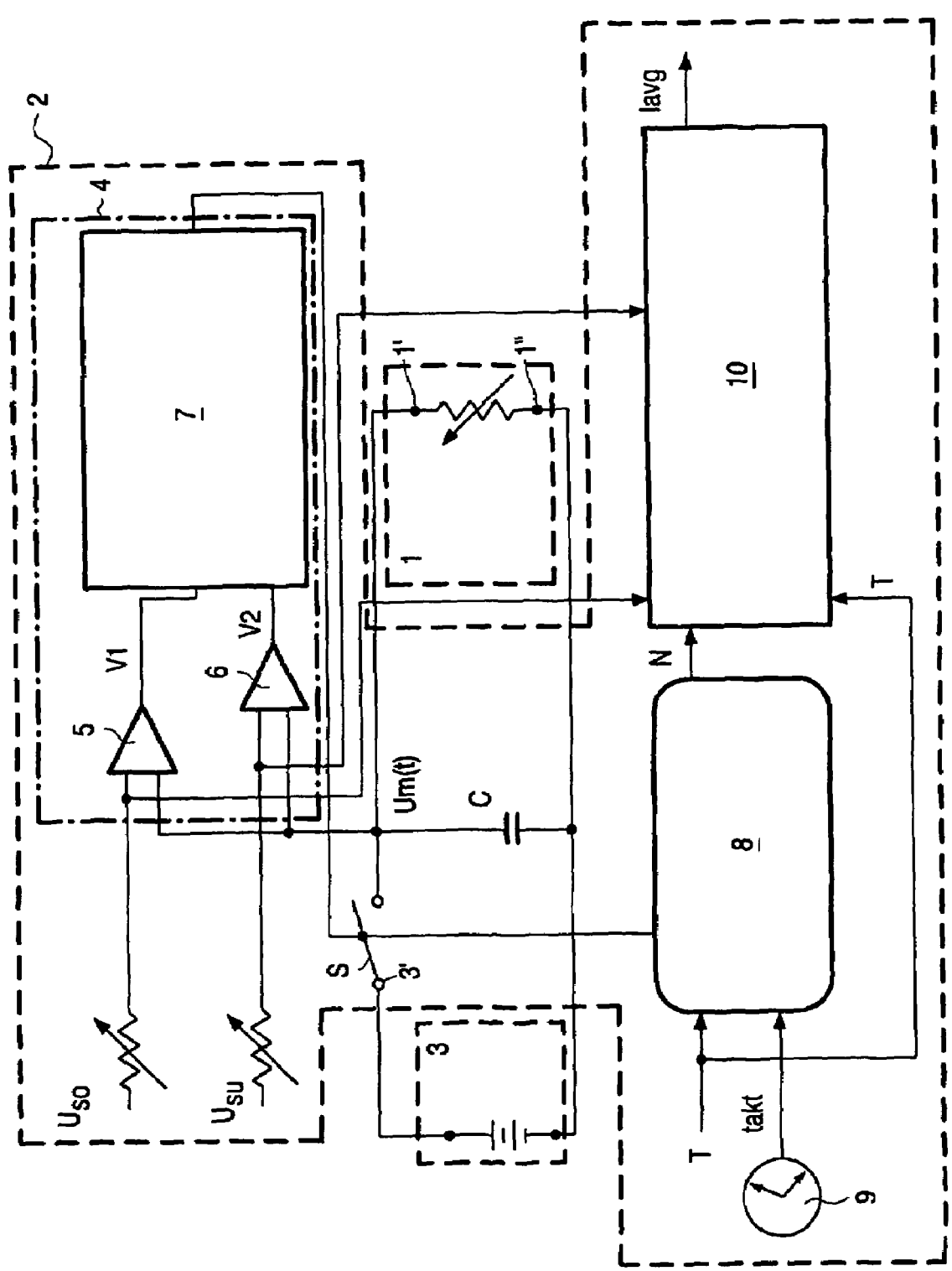

METHOD AND CIRCUIT ARRANGEMENT FOR DETERMINING THE AVERAGE CURRENT CONSUMPTION OF A BATTERY-OPERATED APPARATUS

The invention relates to a method for determining the average current consumption of an electronic apparatus, in particular an apparatus controlled by a microcontroller and/or signal processor, operable by means of an energy source, in particular a battery or accumulator. The invention additionally relates to a circuit arrangement for performing the method.

For a technical description of a battery-operated apparatus, for example a cellphone apparatus, the operating period possible per battery charge-up has to be indicated, so that the user can form an idea of the possible running time of the apparatus between two battery charging sessions.

Microcontrollers and/or signal processors are used in many battery-operated apparatuses. The current consumption of these apparatuses depends on the hardware used and also to a considerable extent on the software used. Current consumption is dependent on the respective operating state of the apparatus and on the particular program code being run.

One possible way of determining running time is to switch on the apparatus with a fully charged battery and to measure the time between switching on and switching off of the apparatus, such switching off occurring automatically when the battery has become discharged to an extent such that the apparatus can no longer operate reliably. This time is the running time of the apparatus. A problem with this is that battery running times may be very long, extending over weeks, months or even years. The measuring time would have to be correspondingly long, but such long measuring times are not acceptable in practice.

Another option is to measure average current consumption over a limited period, in which the essential operating states of the apparatus occur. The running time of the apparatus may then be calculated from the nominal capacity of the fully charged battery and the average current consumption. According to the prior art, current measurement is effected using the voltage dropping across at an ohmic resistor, which voltage is proportional to the flowing current. For digital further processing, a large number of voltage values have to be measured over the period. Since current consumption in electronic apparatuses often fluctuates rapidly with large amplitude dynamics, low error measurement is not easily possible. In the case of mobile telephones, for example, current consumption fluctuates between approximately 2 mA and 2 A in typical operating states.

Methods of measuring the current consumption of an apparatus are described in U.S. Pat. No. 5,528,136, U.S. Pat. No. 6,291,971, U.S. Pat. No. 5,869,960 and EP 1 022 575.

It is an object of the invention to propose a method and circuit arrangement, wherein the average current consumption of the apparatus may be determined simply and with a low error rate even if the current consumption of the apparatus fluctuates rapidly over time and to a considerable degree with regard to amplitude.

According to the invention, the above object is achieved with regard to method by the features of claim 1 and with regard to the circuit arrangement by claim 6.

In the case of the described method and the described device, a measuring resistor, through which the current to be measured flows, is unnecessary and is not provided. An energy store is charged repeatedly within the set measuring time and discharged across the apparatus. The duration of the discharging process is longer or shorter depending on the respective current consumption of the apparatus. The respective current is converted into a period of time. The number of charging processes occurring within the set measuring time is counted and the average current consumption is calculated from this number and the set values.

Thus, very precise determination of the average current consumption of the apparatus is possible even in the case of current consumption phases fluctuating markedly over time with regard to amplitude.

The measuring time is preferably set in such a way that the typical operating sequences occur within it. The measuring time is substantially shorter than the running time of the energy source, battery or accumulator.

The upper threshold value and the lower threshold value are set in such a way that they lie within the range in which the energy source is capable of operating the apparatus. Thus, the apparatus does not yet switch off on reaching the lower threshold value.

A capacitor is preferably used as energy store. The upper threshold value and the lower threshold value are then voltage threshold values for the voltage dropping across the capacitor. However, it is also possible to use an inductance, in particular a coil, as energy store.

Figure 2:
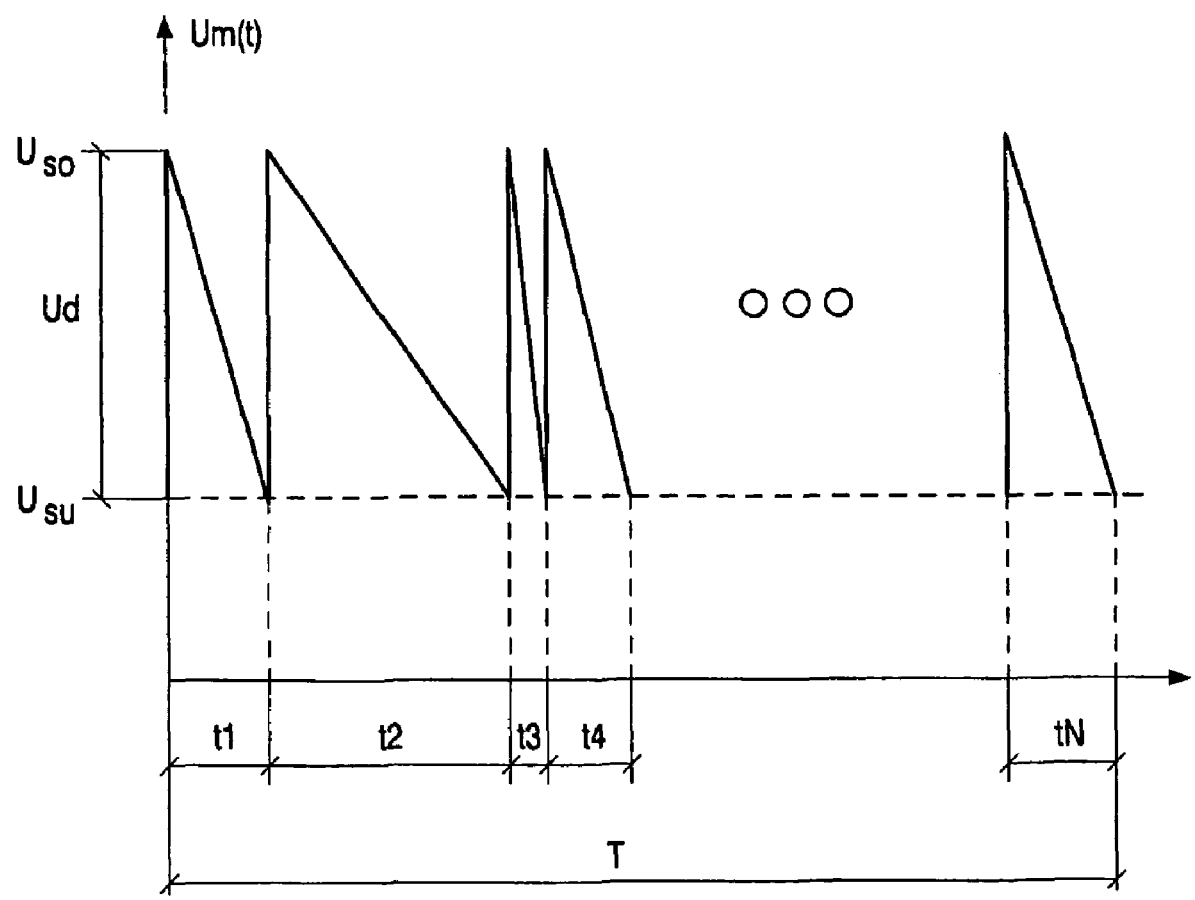

The invention will be further described with reference to embodiments shown in the drawings to which, however, the invention is not restricted. In the drawings:

FIG. 1 is a block diagram of a circuit arrangement for determining the average current consumption of a battery-operated electronic apparatus and FIG. 2 shows an example of a charging profile at the energy store over the measuring time.

In the case of an electronic apparatus I, for example a mobile telephone, the average current consumption Iavg needs to be determined. To control its functions, the apparatus 1 includes a microcontroller and/or signal processor, (not shown). The current consumption of the apparatus 1 fluctuates considerably and more or less rapidly according to the various program-controlled operating sequences. For example, current consumption fluctuates between 2 mA and 2 A. To supply the apparatus with current, a battery, particularly a rechargeable battery, is provided as energy source.

To determine the average current consumption, a circuit arrangement 2 is provided which is illustrated in FIG. 1 by dotted lines. The circuit arrangement 2 is connected to an energy source 3. The energy source 3 may be the battery provided for operation of the apparatus 1 or an equivalent power supply unit. A switching element S of the circuit arrangement 2 may be connected in series between a connection terminal 1' of the apparatus 1 and a connection terminal 3' of the energy source 3. A capacitor C is connected as energy store in parallel with the connection terminals 1' and 1" of the apparatus 1. The capacitance thereof is for example of the order of 5 mF to 40 mF, especially 7 mF to 20 mF.

The circuit arrangement 2 comprises a comparator assembly 4 with two comparators 5, 6, which are connected to a logic circuit 7. An upper, adjustable voltage threshold value Uso and the measuring voltage Um(t), respectively, present at the capacitor C are applied to the comparator 5. A lower, adjustable voltage threshold value Usu and the measuring voltage Um(t), respectively, present at the capacitor C are applied to the comparator 6. The logic circuit 7 switches the switching element S to a non-conductive state if the voltage Um(t) becomes greater than Uso. The logic circuit 7 switches the switching element S to a conductive state if the voltage Um(t) becomes smaller than the voltage threshold value Usu. The voltage threshold values lie in a voltage range within which the apparatus 1 continues to operate. If the operating voltage of the apparatus 1 is, for example, 4.2 V to 3.0 V, the upper threshold value is set, for example, at 3.8 V and the lower threshold value at 3.5 V.

If the switching element S is switched to a conductive state, the capacitor C is charged by the energy source 3 and the voltage Um(t) rises rapidly to the voltage threshold value Uso. When the upper threshold value Uso is reached, the switching element S opens, whereupon the capacitor C discharges across the apparatus 1 until the lower voltage threshold value Usu is reached. It is assumed below that the charging time for the capacitor C is zero and that discharging of the capacitor C proceeds in a substantially linear manner between the voltage threshold values Uso and Usu (c.f. FIG. 2).

In the discharging phase, the apparatus 1 operates with a current consumption corresponding to the respective operating state. The discharging time of the capacitor C depends on the current consumption in the respective operating state. When the lower voltage threshold value Usu is reached, the switching element S is switched back to conductive, such that the capacitor C recharges. The charging/discharging processes are repeated. The voltage diagram of FIG. 2 shows a plurality of such charging processes, which each have different discharging times t1, t2, t3, t4 . . . tN due to different operating phases or current consumptions of the apparatus.

In order to count the number N of charging processes occurring in a set measuring time T, the circuit arrangement 2 comprises a counter 8 with a clock generator 9. The counter 8 responds to switching on and/or off of the switching element S. The measuring time T is set in such a way that the typical operating states of the apparatus 1 occur within it.

It has been shown that a measuring time T of from 1 s to 60 s, in particular 5 s to 30 s, is suitable in the case of a conventional mobile telephone. The measuring time T may however also be differently selected to correspond to the probable occurrence of the operating processes with different current consumptions.

A computing unit 10 of the circuit arrangement 2 determines the average current consumption from the counted number N of switching processes or discharging processes occurring in the measuring time T and the set measuring time T together with the set upper and lower voltage threshold values Uso, Usu and the known capacitance of the capacitor C. The current In each of the time periods t1, t2, t3, t4 . . . tN is:

$$I_n = C \times Ud/tn,$$

wherein $I_n$ is the average current of the respective discharging process,

C is the capacitance of the capacitor C,

Ud is the voltage difference between the upper voltage threshold value Uso and the lower voltage threshold value Usu and tn is the duration of the respective discharging process.

The average current $I_{avg}$ over the complete measuring time T is calculated by the computing unit 10 from $$I_{avg} \times T = \sum_{i=1}^{n} I_n \times Tn = \sum_{i=1}^{n} C \times Ud = N \times C \times Ud$$

which leads to:

$$I_{avg} = (N \times C \times Ud)/T.$$

The expected battery running time may then be calculated from the average current Iavg by dividing the capacity of the battery by the average current Iavg.

It is favorable that, to determine the average current Iavg, only one value, i.e. the number N of discharging processes in the measuring time T, has to be determined if the measuring time T, the capacitor capacitance C and the difference between the voltage threshold values Usu and Uso are kept constant. The average current may thus also be detected reasonably precisely (<5% deviation from actually flowing current in test set-up) even in the case of current consumptions which vary considerably over time and with regard to amplitude. Since measuring resistors are not necessary, there are no problems with regard to voltages falling at the apparatus in the event of high load currents.

The above circuit arrangement may be produced with the components 4 and C in an analog circuit structure and with the components 8, 9, 10 in a discrete structure with digital logic, with programmable logic, for example FPGAs (field programmable gate arrays), microcontrollers or a connected computer with possibilities for analog value processing.

The invention claimed is:

1. A circuit arrangement for determining the average current consumption of a battery-operated electronic apparatus, characterized in that a switching element (S) is positioned between an energy source (3) and the apparatus (1), and In that an energy store (C) is provided which is chargeable from the energy source (3) across the switching element (S) and which is dischargeable across the apparatus (1), in that a comparator assembly (4) determines the charging state of the energy store (C), the comparator assembly (4) switching the switching element (S) to the non-conductive state if the predetermined upper threshold value (Uso) is exceeded and switching the switching element (S) to the conductive state if the lower threshold value (Usu) is fallen below, the energy store (C) being charged when the switching element (S) is in the conductive state and discharged across the apparatus (1) in accordance with the respective current consumption thereof when the switching element (S) is in the non-conductive state, and in that a counter (8) is provided, which counts the number (N) of charging and/or discharging processes occurring within the predetermined measuring time (T), and in that a computing unit (10) is provided which calculates the average current consumption from the number (N), the measuring time (T) and the determined size of the energy store (C) as well as with the upper threshold value (Uso) and the lower threshold value (Usu).

2. A circuit arrangement as claimed in claim 1, characterized in that the energy store is a capacitor.

3. A circuit arrangement as claimed in claim 2, wherein the capacitance of the capacitor amounts to approximately 5 mF to approximately 40 mF.

4. A circuit arrangement as claimed in claim 1, wherein the measuring time (T) amounts to from 1 s to 45 s, the capacitance of the capacitor (C) being so high that in the case of a typical operating sequence a plurality of charging and discharging processes occur during the measuring time (T).

5. A circuit arrangement as claimed in claim 1, wherein the upper threshold value lies between approximately 4.2 V and approximately 3.6 V and the lower threshold value lies approximately between 3.5 V and approximately 3.0 V.

6. A circuit arrangement for determining the average current consumption of a battery-operated electronic apparatus, comprising:
- a switching element positioned between an energy source and the apparatus;
- an energy store, wherein the energy store is chargeable from the energy source across the switching element and is dischargeable across the apparatus;
- a comparator assembly adapted to determine a charging state of the energy store, the comparator assembly switching the switching element to the non-conductive state if the predetermined upper threshold value is exceeded and switching the switching element to the conductive state if the lower threshold value is fallen below, the energy store being charged when the switching element is in the conductive state and discharged across the apparatus in accordance with the respective current consumption thereof when the switching element is in the non-conductive state;
- a counter operative to count a number of charging and/or discharging processes occurring within the predetermined measuring time; and
- a computing unit adapted to calculate an average current consumption from the number, the measuring time, a determined size of the energy store, the upper threshold value and the lower threshold value.

7. A circuit arrangement as claimed in claim 6, wherein the energy store is a capacitor.

8. A circuit arrangement as claimed in claim 7, wherein the capacitance of the capacitor amounts to approximately 5 mF to approximately 40 mF.

9. A circuit arrangement as claimed in claim 7, wherein the measuring time amounts to from 1 s to 45 s, the capacitance of the capacitor (C) being so high that in the case of a typical operating sequence a plurality of charging and discharging processes occur during the measuring time (T).

10. A circuit arrangement as claimed in claim 6, wherein the upper threshold value lies between approximately 4.2 V and approximately 3.6 V and the lower threshold value lies approximately between 3.5 V and approximately 3.0 V.

* * * * *